(12) United States Patent  
Bühler et al.

(10) Patent No.: US 6,707,304 B2
(45) Date of Patent: Mar. 16, 2004

(54) DEVICES AND METHODS FOR DETECTING A PROCESSING ELECTRODE OF A MACHINE TOOL

(75) Inventors: Ernst Bühler, Losone (CH); Juri Cugini, Losone (CH); Karl Tobler, Maggia (CH); Walter Dal Bò, Massagno (CH)

(73) Assignee: Agie SA, Losone (CH)

( * ) Notice: Subject to any disclaimer, the term of this patent is extended or adjusted under 35 U.S.C. 154(b) by 0 days.

(21) Appl. No.: 10/004,966

(22) Filed: Dec. 4, 2001

(65) Prior Publication Data
US 2002/0093348 A1 Jul. 18, 2002

(30) Foreign Application Priority Data

Dec. 12, 2000 (DE) .......................... 100 61 691

(51) Int. Cl.$^7$ .............................................. G01R 31/08
(52) U.S. Cl. .................. 324/525; 219/69.11; 219/69.16
(58) Field of Search ................................ 324/525, 71.1, 324/71.4, 658, 691; 219/68, 69.11, 69.12, 69.13, 69.2, 69.16, 69.17; 204/206; 205/645, 652, 654, 686

(56) References Cited

U.S. PATENT DOCUMENTS

| 4,232,208 A | * | 11/1980 | Buhler | 219/69 W |
|---|---|---|---|---|
| 4,412,118 A | | 10/1983 | Nomura et al. | 219/69 W |
| 4,609,803 A | | 9/1986 | Inoue | 219/69 W |
| 4,689,462 A | | 8/1987 | Goto | 219/69 W |
| 4,998,003 A | | 3/1991 | Kawanabe | 219/69.12 |
| 5,019,684 A | | 5/1991 | Ito | 219/69.12 |
| 5,177,334 A | * | 1/1993 | Magara et al. | 219/69.12 |
| 5,187,342 A | * | 2/1993 | Aso et al. | 219/69.14 |
| 5,268,551 A | | 12/1993 | Kawanabe et al. | 219/69.12 |
| 5,369,239 A | | 11/1994 | Itoh | 219/69.13 |
| 5,523,545 A | | 6/1996 | Maidagan | 219/69.12 |
| 6,169,407 B1 | | 1/2001 | Wang et al. | 324/690 |

FOREIGN PATENT DOCUMENTS

| DE | 28 26 270 C2 | 9/1979 |
|---|---|---|
| DE | 41 37 016 C2 | 5/1993 |
| DE | 196 07 705 A1 | 2/1996 |
| DE | 196 45 547 A1 | 11/1996 |
| DE | 199 32 645 C1 | 7/1999 |
| EP | 0 161 657 B1 | 5/1985 |

OTHER PUBLICATIONS

"Linear Circuits, Voltage Regulators/Supervisors, Comparators, Special Functions and Building Blocks" Data Book D2784 (Nov. 1991), of Texas Instruments, Dallas, Texas, 11 Pages.

* cited by examiner

Primary Examiner—N. Le
Assistant Examiner—Amy He
(74) Attorney, Agent, or Firm—Marshall, Gerstein & Borun LLP

(57) ABSTRACT

Devices and methods are disclosed for the contactless detection of a bar-shaped or wire-shaped processing electrode of a machine tool such as a spark erosion machine. The detection is based on measuring an impedance change in the measuring area, which is caused by the processing electrode moving through the measuring area. The impedance change is measured by one or more measuring electrodes disposed in the measuring area.

30 Claims, 8 Drawing Sheets

DEVICES AND METHODS FOR DETECTING A PROCESSING ELECTRODE OF A MACHINE TOOL

FIELD OF THE INVENTION

The invention relates to machine tools, and more particularly to devices and methods for the contactless detection of a processing electrode of a machine tool.

BACKGROUND OF THE INVENTION

Spark erosion machines are used to machine work pieces by means of electrical spark discharge between an electrically conducting workpiece and a processing electrode. In particular, the workpiece can be cut by means of a wire electrode or it can be machined by means of a bar-type cavity sinking electrode in that it is drilled or hollowed. In this process, in addition to removing material particles from the work piece the processing electrode itself also wears off. Consequently, new electrode material has to be supplied continuously to the work area of the spark erosion machine. In a known wire spark erosion machine, for example, the wire electrode moves from a dispenser roll via several pulleys and conveyor lines to the top wire guiding arm from where the wire electrode is moved via additional pulleys and a brake roll that controls the tensile stress of the wire electrode in the work area to the top wire guiding head where a power supply unit is provided for supplying the processing current.

The wire electrode continues from the top wire guiding head through the work area (where a work piece is mounted for machining) to the bottom wire guiding head from where it is guided into the disposal area via another pulley. While the work piece is being machined the wire electrode moves through the wire moving system at a speed of approximately 100–300 mm/sec.

Inserting the wire electrode or reinserting a broken wire electrode into the electrode moving system is a difficult and time-consuming job. The manufacturers of machine tools always try to design user-friendly products and to automate such operations so as to allow the operating personnel to focus on programming and supervising the system. In modern wire spark erosion machines the inserting process is at least partially automated, for example by means of using nozzles that spray a stream of fluid into a conveyor tube, thus pulling in the wire electrode and moving it along.

In order to be able to automate the insertion and movement of the wire electrode in the electrode moving system as fully as possible it is desirable to always know the current position of the electrode tip so as to activate or deactivate suitable moving means at the appropriate time and set suitable control parameters for the wire moving system. Also, insertion errors are easier to diagnose and correct with this method. Therefore, any required manual intervention by the operating personnel can be reduced to a minimum. "Electrode tip" should be understood to mean both the beginning and the end of the wire electrode as it can be very useful to know where the remainder of the wire electrode is located, for example when the wire breaks or when it is cut so as to quickly reinsert it and minimize the system downtime.

In micro-drilling, the position of the electrode end can be detected and, based on this detection, the remaining length of the electrode is determined. Hereinafter, the term electrode tip will be used for such cases as well.

In the prior art, various detection methods are used to detect the electrode tip. For example, U.S. Pat. No. 4,412, 118 specifies a device for detecting the position of the wire tip when the wire breaks or when the wire is cut intentionally. In this case, the wire electrode is rewound after the interruption whereby it touches a sliding contact. A comparator circuit detects when the contact between the sliding contact and the wire electrode stops and discontinues rewinding the electrode. A variant is also disclosed where the wire is detected contactless by means of a photo sensor.

Similar wire detection methods are disclosed in U.S. Pat. No. 5,019,684 and U.S. Pat. No. 5,268,551 where a sliding contact or a photo sensor are also used for wire detection. The device specified in U.S. Pat. No. 5,019,684 additionally measures the length of the return path while the electrode is rewound and based on this it determines the location of the wire break.

Another wire detector, which is based on electrically contacting the wire electrode, is disclosed in U.S. Pat. No. 5,523,545.

For completeness' sake German Patent DE 28 26 270 C2 should also be mentioned. This document specifies a different device not related to detecting the wire end. It relates to detecting and compensating the wire deflection caused by the spark erosive process forces (i.e. the deflection of the wire electrode on a plane that is vertical relative to the direction in which the wire advances). The proposed wire position sensor includes four measuring electrodes each of which is spaced apart from the wire electrode in one of the four axial directions +x, −x, +y and −y. A dielectric having a conductivity of 1–100 μS/cm flows through the overall arrangement. The deflection of the wire electrode in the xy direction is measured in that the change in the resistance is detected between the four measuring electrodes and the wire electrode serving as a common electrode for all four measuring cells.

In the detectors known from the prior art which are based on sliding contacts it was found to be disadvantageous that the detector is in continuous contact with the processing electrode which could adversely affect the electrode moving system. Also, the sliding contacts are susceptible to corrosion and subject to wearing and tend to develop insulating oxide layers. For this reason sliding contacts are unsuitable for low sensor voltages in the wet area of an erosion machine. Even in a largely automated wire moving system of a wire spark erosion machine, for example where a wire electrode is moved via wire guiding tubes and rerouting units, a non-contact detection is advantageous. Although photo sensor arrangements are found in the prior art for contactless wire detection, the contactless detection has to be traded off against various other disadvantages, depending on the structural design of the photo sensors. Because the electrode wire moves continuously, dirt, paraffin, metal and metal oxide deposits have to be expected which contaminate the photo sensor and, thus, cause malfunctions.

It is also known that when the wire is moved via a fluid through a substantially closed tube system it is possible that air bubbles will develop. Optical sensors can be affected by such air bubbles, and they could cause it to operate improperly. Furthermore, a wire detector is frequently subjected to the transport fluid which is under pressure so that the photo sensors have to meet special requirements with regard to tightness. Therefore, optical sensors overall are relatively susceptible to malfunctioning. An ideal wire detection device should be able to detect the full spectrum of wire and bar-type electrodes available on the market. Therefore, it has to be highly sensitive and cover a considerable measuring range because it has to be able to work across the full cross-section of the moving system. Any optical sensors meeting the above requirements are very expensive.

OVERVIEW OF THE DISCLOSED EXAMPLES

A device is disclosed for detecting a processing electrode which is compact and cost-effective. The device is for the contactless detection of a bar-shaped or wire-shaped processing electrode of a machine tool (e.g., a spark erosion machine), having a measuring area through which the processing electrode can be moved. At least one measuring electrode is disposed in the measuring area. The detection is based on an impedance change in the measuring area which is caused by the processing electrode moving through the measuring area.

Furthermore, a wire spark erosion machine is proposed which is equipped with detection devices in multiple places along the moving path of the wire electrode so as to monitor the wire moving system, thereby allowing the wire moving system to be fully monitored.

Additionally, a method is provided for the contactless detection of a bar-shaped or wire-shaped processing electrode of a machine tool (e.g., a spark erosion machine), in a measuring area through which the processing electrode can be moved. An impedance change is detected in the measuring area by at least one measuring electrode disposed in the measuring area when the processing electrode moves through the measuring area.

"Detection" not only means the differentiation between the "processing electrode present" status and the "processing electrode not present" status, it advantageously also includes measuring the accurate position and/or other characteristics of the processing electrode.

The disclosed devices and methods allow a wide spectrum of processing electrodes to be detected. Without requiring the problematic contact with the processing electrode such electrodes may have varying diameters, cross-sections and be made of different materials. The described detection method is preferably suitable for monitoring the wire moving system of wire spark erosion machines, but the method can just as advantageously be used in cavity sinking spark erosion machines (e.g., drilling spark erosion machines, milling spark erosion machines or micro cavity sinking spark erosion machines) because the processing electrodes used in these types of system are substantially bar-shaped.

Therefore, while the preferred primary application is the detection of electrically conducting wires or bars, the disclosed method is suitable for any measured object, including non-conducting objects, that cause a detectable change in the impedance (for example the resistive and/or capacitive component within the measuring area). Furthermore, the disclosed devices can be produced cost-effectively and do not require much space in the measuring area.

The measuring area is preferably filled with a transport fluid for the processing electrode. This fluid has an electrical conductivity that differs from the electrical conductivity of the processing electrode. Consequently, the impedance in the measuring area changes when the processing electrode moves through in that a portion of the fluid is displaced and replaced by the material of the processing electrode having a different conductivity. A transport fluid is usually used, especially in wire spark erosion machines, for inserting the processing electrode into the electrode moving system. At least while it is being inserted, which is a procedure during which the processing electrode can easily jam, stick or otherwise be misguided making it especially useful to monitor the electrode moving system, the moving path of the processing electrode is always filled with the transport fluid which can then also be used for the measurement.

The resistive component (hereinafter referred to as resistance) of the impedance change in the measuring area is analyzed. The measuring area is preferably filled with a transport fluid whose electrical conductivity is considerably lower than that of the processing electrode, but having a certain minimum conductivity of 1 $\mu$S/cm, for example. Therefore, the resistance in the fluid-filled measuring area is relatively high as long as the processing electrode is absent. When a processing electrode with a high electrical conductivity moves through the measuring area, the total resistance in the measuring area decreases considerably as a path having a lower resistance is now present through a portion of the measuring area in the form of the processing electrode.

Two or more measuring electrodes are preferably disposed so as to be spaced apart in the direction in which the processing electrode advances to allow measuring the position of the processing electrode along the advancement path as accurately as possible. Alternatively, one measuring electrode is disposed in the measuring area while a second measuring electrode is formed by the processing electrode itself.

In a preferred embodiment, the measuring electrodes are ring-shaped. The device then preferably comprises two ring-shaped measuring electrodes spaced apart in the direction in which the processing electrode advances, and defining a cylindrical measuring area through which the processing electrode can be moved in an axial direction. The ring-shaped configuration of the electrodes is especially advantageous as the measured impedance is largely independent of the radial position of the processing electrode within the rings.

However, the measuring electrodes can also have other configurations. For example, they can be pin-shaped, U-shaped or assembled from several partial measuring electrodes. When the moving path is configured so as to be open (for example as a U-shaped channel), U-shaped measuring electrodes are advantageously used so as to keep the access to the channel unobstructed. As compared to optical detectors, the measuring detectors have the advantage that they are easily adaptable to the cross-section of the channel.

In another example, the capacitive component of the impedance change in the measuring area is evaluated. In this embodiment, two measuring electrodes, for example, cover a large portion of the measuring area, thus forming a type of capacitor whose capacity changes when the processing electrode moves through. In this case, it is advantageous that an insulating transport fluid can also be present between the processing electrode and the measuring electrode(s) (for example, air or a hydrocarbon). Furthermore, the measuring electrodes are not required to be in direct contact with the fluid in the measuring area. They are preferably mounted on the outside of an insulating protective sleeve encompassing the measuring area.

In still another example, the detection is substantially based on detecting the change in the inductive component of the impedance in the measuring area. A conducting processing electrode has a line inductance (albeit low), which can be detected based on an accurate measurement of the current in the measuring area, for example. In an alternative variant, the wire electrode in combination with the transport fluid flowing via a bypass forms a short-circuited secondary winding of a transformer where the induced secondary current changes depending on the proportion of the wire electrode in the electric circuit. The transmission of the measurement to the primary side is purely inductive. This variant is very robust electrically and mechanically, and it is also suitable for detection during erosion machining.

The detection of the processing electrode can preferably also be based on the evaluation of a combination of the resistive, the capacitive and/or the inductive components of the impedance change. For example, a combination of the inductive and resistive detection methods is advantageous.

During the measurement, an alternating voltage is preferably applied to one or more measuring electrode(s) and the capacitive, inductive and/or resistive component(s) of the impedance in the measuring area is determined based on the measured current. An alternating voltage source has the advantage that the measuring electrodes will not be damaged by the effects of electrolysis, electrophoresis or corrosion even in continuous operation.

The inside diameter of the device is preferably substantially equal to the inside diameter of the remaining electrode moving system in the machine tool as the device should not cause an obstruction when the processing electrode is inserted. Inserting the electrode is very difficult, especially in wire spark erosion machines, as the electrode consists of a wire having a width of only 10–350 $\mu$m. Therefore, mistakes can easily occur when the electrode is inserted. The transport fluid, with which the wire electrode is typically moved through the wire moving system should also flow unobstructed through the detection device so as not to cause any turbulence or a pressure drop in the measuring area.

On the other hand, the measuring sensitivity of the device will increase if the detection device has a smaller inside diameter. In order to solve this conflict of interests, it is proposed to preferably configure the inside diameter of the detection device substantially smaller than the inside diameter of the remaining electrode moving system, while leading a portion of the transport fluid around the measuring area by means of a bypass.

In a preferred method, the impedance measured by a first detection device in a first measuring area is compared with the impedance in the measuring area of a second device through which the processing electrode does not move, but which is filled with the same fluid as the first device. As long as no processing electrode is present the two measuring devices will provide the same impedance value. When the processing electrode moves through the first measuring area the first device detects an impedance change while the impedance in the second measuring area will always remain constant. Therefore, no absolute impedance measurement is required for detection, only a comparative measurement. As a result, the impedance does not need to be measured with high absolute accuracy, and the necessity for a periodic calibration of the detection device is eliminated. The method can also be applied if the second detection device outside the moving path of the electrode is structurally not exactly identical with the first detection device. The varying characteristics of the two detection devices have to be recorded only once, and they have to be taken into consideration for detection by means of a conversion factor. The so-called comparator sensor method is characterized by an especially high resistance against interfering outside effects.

The disclosed devices not only permit the position of the processing electrode to be detected with high accuracy (a few millimeters, for example), it is also possible to measure other properties of the processing electrode. For example, the diameter of the processing electrode is preferably determined based on the impedance change when the processing electrode moves through the measuring area. When the geometric dimensions of the detection device are known the diameter of the processing electrode, which is the only unknown parameter, can be determined based on the conductivity of the transport fluid and the conductivity of the electrode material.

If the diameter of the processing electrode is also known, the surface quality of the processing electrode can also be determined based on the impedance change when the processing electrode moves through the measuring area. The surface quality (e.g., a contamination of the processing electrode, such as wax), can have a highly adverse effect on the spark erosion process. Such contamination can be detected because it insulates the processing electrode against the outside. The measurement of the resistive component of the impedance change would, therefore, result in only a minor drop in the resistance when the processing electrode moves through the measuring area.

Positioning the detection devices in various places of the wire moving system of a wire spark erosion machine permits the overall wire path to be monitored, and predetermined wire moving strategies can be triggered depending on the measured position of the wire electrode.

DETAILED DESCRIPTION OF EXAMPLES

A detection method will be described below in the context of detecting a wire-shaped processing electrode of a wire spark erosion machine. However, the method also applies to the detection of a ribbon-type or bar-type processing electrode. The description and the drawings show only the relevant components of a spark erosion machine as required to understand the disclosure. A more detailed description of a wire moving system is found in German Patent DE 196 07 705 A1 filed by the applicant, which is hereby incorporated into this application by reference. As used herein, identical components in the various examples have the same reference numbers.

Figure 1:
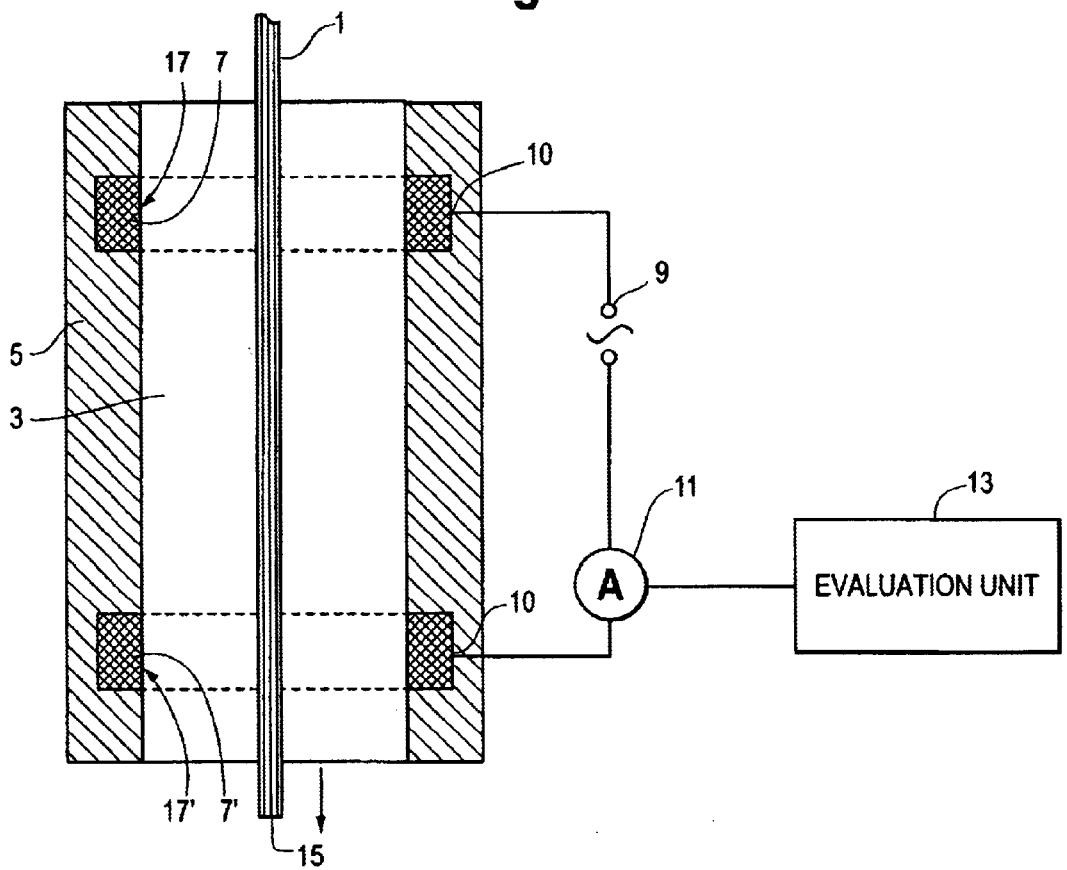
FIG. 1 is a longitudinal sectional view of an exemplary device constructed in accordance with the teachings of the invention.

FIG. 1 shows a longitudinal section of an exemplary device having a measuring area 3 through which a processing electrode 1 can be moved. The processing electrode 1 shown in the drawing is a fine wire electrode having a diameter of 10–350 μm, for example. The electrode may substantially consist of brass or tungsten, for example. However, the device is also suitable for detecting a bar-type microelectrode for a micro cavity sinking spark erosion system having a cylindrical or tubular cross-section or a special micro cavity sinking profile. The device comprises two ring-shaped measuring electrodes 7 and 7' that are spaced apart in the direction in which the processing electrode 1 advances. These electrodes 7, 7' define a cylindrical measuring area 3 in between on whose axis the wire electrode 1 moves through the measuring area 3 in the direction of the arrow. The measuring area 3 is filled with a transport fluid (which is not shown), by means of which the wire electrode 1 is moved through the electrode moving system of the spark erosion machine, at least while it is being inserted. In the illustrated example, the transport fluid is deionized water having a low electrical conductivity. In order not to obstruct the insertion of the wire electrode 1, the device has an inside diameter that is substantially equal to the inside diameter of the remaining moving path of the electrode, for example a wire guiding tube.

The measuring area 3 is encompassed by a cylindrical protective sleeve 5 which is preferably made of electrically insulating plastic. In this example, the measuring electrodes 7, 7' are embedded on the inside of the protective sleeve, but they are in direct conducting contact with the transport fluid in the measuring area 3 with their ring-shaped inside surfaces 17. The measuring electrodes 7, 7' are connected to an alternating voltage source 9 via the connections 10. During a measurement an alternating voltage is applied to the measuring electrodes 7, 7' and the current flowing between the electrodes 7, 7' is measured by means of a current sensor 11. The applied voltage and the measured current are transmitted to an evaluation unit 13 that determines the resistance (i.e., the resistive component of the impedance in the measuring area based on the measured values). By measuring the characteristic of the detection device in advance, the output signal can be linearized such that it will directly indicate the axial position of the processing electrode tip in the measuring area.

With this device, it should be ensured that the transport fluid in the measuring area 3 will not be able to advance as far as the electrical connections 10 or even the current sensor 11 or the voltage source 9 because such an infiltration would alter the characteristic of the detection device and distort the measurement. For this reason, the ring-shaped measuring electrodes 7, 7' are sealed against the transport fluid entering as a result of a capillary effect. Cost-effective O-ring seals can be used for this, for example.

The chronological process of the measured resistance when a processing electrode 1 moves through the measuring area 3 will be explained below. Before the tip 15 of the processing electrode 1 reaches the measuring area 3 the measured resistance is high because the resistance of the fluid cylinder is measured between the ring-shaped measuring electrodes 7, 7'. As mentioned above, the transport fluid is deionized water having a low conductivity. As soon as the tip 15 of the processing electrode 1 reaches the section between the two ring-shaped measuring electrodes 7, 7' the electrical resistance drops considerably. The reason for this is that the processing electrode 1 has a high electrical conductivity compared to the fluid and that the current partially flows through the processing electrode 1 when the latter is present. For example, the measured resistance reaches a minimum of approx. 50% of the starting value when the tip 15 of the processing electrode 1 reaches the level of the second ring-shaped measuring electrode 7'. In the state as shown where the tip 15 of the processing electrode 1 has already fully passed the measuring area 3, and based on a simplified model, a current flows from the first ring-shaped measuring electrode 7 through the fluid radially inward to the processing electrode 1, then along the highly conductive processing electrode 1 to the level of the second ring-shaped measuring electrode 7' and then radially outward through the fluid to the second ring-shaped contact surface 17'.

Figure 2:
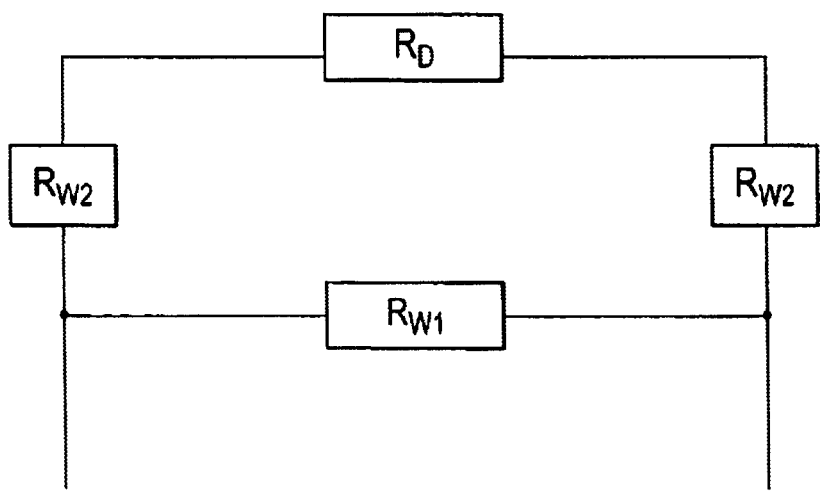
FIG. 2 is a simplified equivalent circuit diagram for the resistive detection device of FIG. 1.

The above simplified model for the resistances of the illustrated device is shown in an equivalent circuit diagram in FIG. 2. Accordingly, when the processing electrode 1 passes there are two routes through the measuring area that are parallel connected. For one, a current flows through the transport fluid directly from one ring-shaped measuring electrode 7 to the second measuring electrode 7'. This route has the resistance referenced $R_{W1}$ of the fluid cylinder between the two measuring electrodes 7, 7'. On the other hand, a current, as described above, flows from the first ring-shaped measuring electrode 7 on a fluid slice having the resistance $R_{W2}$ to the processing electrode, then on a section of the processing electrode 1 having the resistance $R_D$ and through another fluid slice having the resistance $R_{W2}$ from the processing electrode 1 to the second ring-shaped measuring electrode 7'. Therefore, the total resistance in the measuring area $R_{Ges}$ is calculated as follows:

$$\frac{1}{R_{Ges}} = \frac{1}{R_{W1}} + \frac{1}{R_{W2} + R_D + R_{W2}} \qquad (1)$$

When no processing electrode 1 is present in the measuring area the total resistance $R_{Ges}$ is equal to the resistance of the fluid cylinder between the two rings $R_{W1}$.

The above mentioned resistances $R_{W1}$: resistance of the fluid cylinder between the two ring-shaped measuring electrodes, $R_{W2}$: resistance of a fluid slice between the processing electrode and the ring-shaped measuring electrode, and $R_D$: resistance of the processing electrode are calculated based on the inside diameter $D_S$ and the width (the dimension in axial direction) S of the measuring electrodes, the distance L between the two measuring electrodes, the diameter $D_D$ of the processing electrode, the conductivity of the fluid $y_W$ and the conductivity of the processing electrode $y_D$ according to the following equations:

$$R_{W1} = \frac{4 \cdot L}{\gamma_W \cdot D_S^2 \cdot \pi} \qquad (2)$$

$$R_{W2} = \frac{1}{\gamma_W \cdot 2 \cdot \pi \cdot S} \cdot \left( \ln \left| \frac{D_S}{2} \right| - \ln \left| \frac{D_D}{2} \right| \right) \quad (3)$$

$$R_D = \frac{4 \cdot L}{\lambda_D \cdot D_D^2 \cdot \pi} \quad (4)$$

The detection device has a high measuring sensitivity when the change in resistance is as high as possible when the object to be detected passes. The above equations show that the sensitivity depends on the diameter, the width and the space between the ring-shaped measuring electrodes. Therefore, the dimensions of the device are preferably selected so as to achieve maximum sensitivity with the smallest possible structural size and without obstructing the movement of the wire 1 as a result of the inside diameter of the measuring electrodes being too small. Also, when the space between the measuring electrodes 7, 7' is set it should be noted that the electric field between the two electrodes 7, 7' becomes inhomogeneous when the space is too narrow which could lead to significant non-linearity.

The measuring sensitivity also depends on the difference between the conductivity of the processing electrode 1 and that of the transport fluid. In the illustrated example, the conductivity of the fluid $\gamma_W$ is relatively low and the conductivity of the processing electrode $y_D$ is high in comparison. It is also possible to use a highly conductive transport fluid for detecting a non-conductive object.

If the conductivity of the transport fluid is known, the resistance in the presence or absence of the processing electrode 1 in the measuring area 3 can be calculated based on the above equations 1–4. The conductivity value is preferably determined in advance of use as accurately as possible. Various methods and the respective conductance sensors for measuring the conductivity of a fluid are known in the art. However, the detection device itself can also be used for determining the conductivity of the transport fluid. When the dimensions of the ring-shaped measuring electrodes 7, 7' and the space between them is known, the conductivity of the transport fluid can be determined based on the resistance measured between the measuring electrodes in the absence of the processing electrode 1, as shown by equation 2. The calibration can be repeated periodically in order to increase the measuring accuracy.

Figure 3:
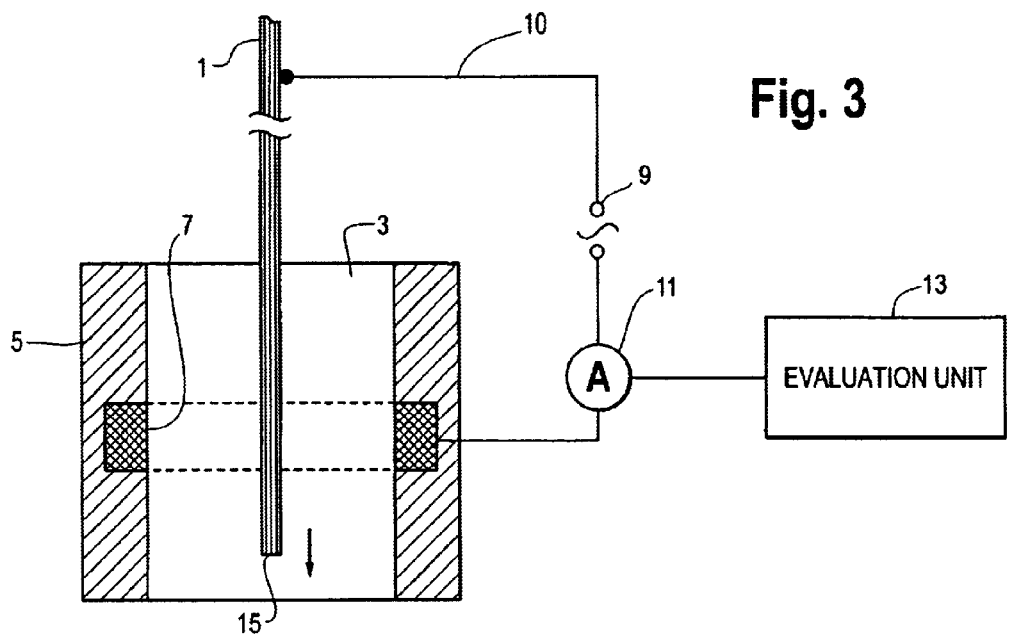
FIG. 3 is a longitudinal sectional view of another exemplary device constructed in accordance with the teachings of the invention.

FIG. 3 shows another exemplary detection device. The device illustrated in FIG. 3 is structured similar to that shown in FIG. 1 in that a processing electrode 1 is also inserted into a measuring area 3 along the direction of the arrow, which measuring area 3 is encompassed by a cylindrical protective sleeve of insulating plastic 5.

In the example in FIG. 3, however, only one ring-shaped measuring electrode 7 is provided while a second measuring electrode is formed by the processing electrode 1 itself. For this purpose, the processing electrode 1 is contacted at a place in the wire moving system which lies upward of the detection device and it is connected to the electric circuit of the measuring electrode 7. The wire electrode can be contacted on the dispenser roll, for example, or in any place in the wire moving system by means of a brush contact. The resistance is determined by the evaluation unit 13 based on the current flowing between the processing electrode 1 and the measuring electrode 7, thereby determining whether the wire tip 15 is present in the measuring area. If no processing electrode 1 moves through the measuring area 3 virtually no current will flow through the current sensor 11. When the tip 15 of the wire electrode 1 enters the measuring area 3 the current increases and reaches its maximum when the tip 15 has passed the ring-shaped measuring electrode 7. In this example, the measuring area 3 is also filled with a low conductive transport fluid.

Figure 4A:
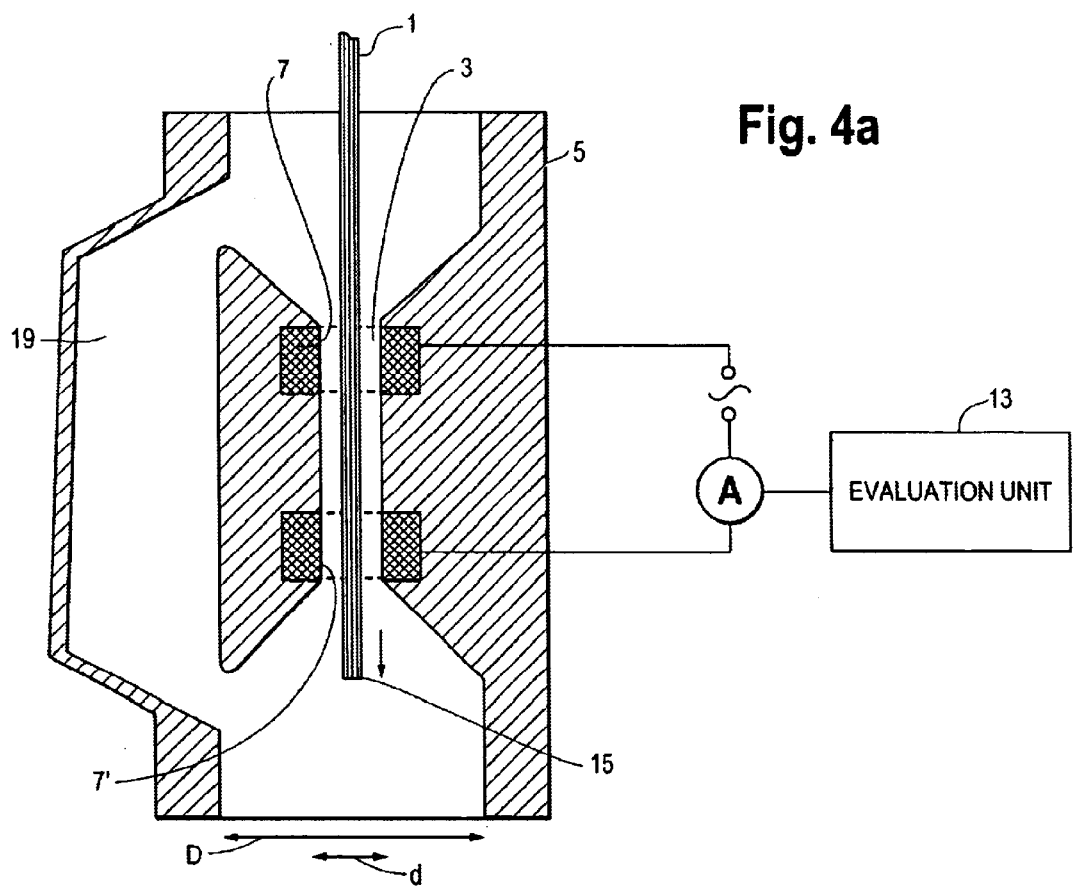
FIG. 4a is a longitudinal sectional view of another exemplary device constructed in accordance with the teachings of the invention.

FIG. 4a shows another exemplary device where the inside diameter of the measuring electrodes 7, 7' is configured as narrow as possible so as to achieve a high measuring sensitivity (see above equation). In order to prevent a "bottleneck" in the wire moving system at the detection device where the transport fluid backs up and obstructs the insertion of a wire electrode 1 a portion of the transport fluid in this example is guided around the measuring area 3 by means of a bypass 19. In the illustrated example, the diameter d of the measuring electrodes 7, 7' and, thus, the inside diameter of the measuring area is half the size of the inside diameter D of the remaining wire moving system. In order not to obstruct the flow of the transport fluid the bypass 19 branches off shortly before the measuring area 3 and rejoins the wire path shortly after the measuring area 3 so as to provide an adequate cross-sectional surface for the flow of fluid in the measuring area 3. A suitable geometric configuration of the detection device ensures that the wire electrode 1 will not collide with the device and that it takes the path through the measuring area 3 when it is inserted.

Figure 4B:
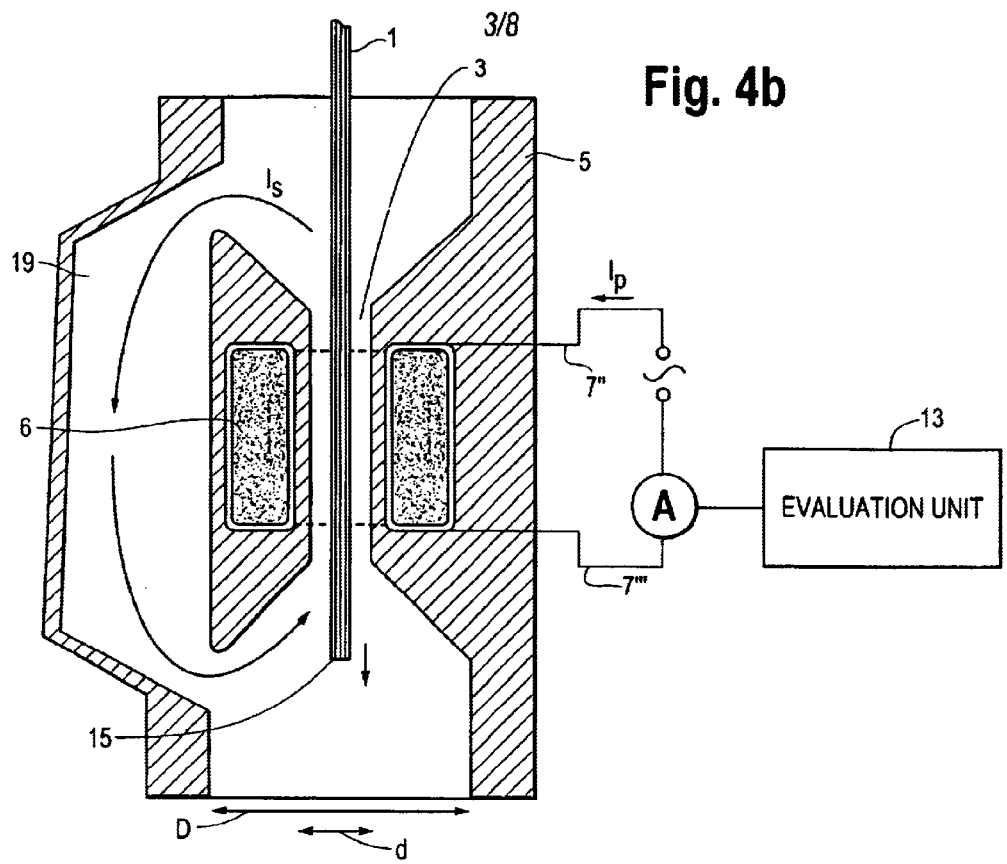
FIG. 4b is a longitudinal sectional view of another exemplary device constructed in accordance with the teachings of the invention.

FIG. 4b shows another exemplary device. This device is similar in structure to FIG. 4a with the difference that the measuring electrodes 7, 7' are replaced by an integrated transformer 6. An alternating voltage source is applied via the connections 7" and 7''', and the primary current $I_p$ is measured by means of a current sensor. In this case, as in the device in FIG. 4a, an electronic evaluation system as per FIG. 10a can be used (comprising a voltage source, a current sensor and an evaluation unit) because the connections 7", 7''' are very similar in behavior to the measuring electrodes 7, 7'. The only difference is a small additional inductive component in the primary current Ip which is caused by the transformer 6. The measuring area 3 becomes a secondary winding of the transformer 6, and a secondary current Is is able to flow via the bypass 19. When the electrode tip 15 moves into the measuring area 3 the resistance in the secondary winding decreases rapidly, the secondary current Is increases, and the primary current Ip also increases in accordance with the transformation ratio of the transformer 6. As an example, a highly permeable ferrite ring core with approximately 10 primary windings can be used for the transformer 6. Because the diameter d of the measuring area 3 is small, but the bypass 19 has a large cross-section, this will also result in a very good measuring effect. The above design provides excellent long-term stability as there are no sensor parts in the wet area. Because of the galvanic separation, the immunity to malfunctioning is also high. This variant works only with a transport fluid conductance of higher than approximately 1 $\mu$S/cm, and, of course, the wire electrode 1 must not carry any parasitic current in the measuring area 3. Consequently, it cannot be placed between a current contact of the generator and the work piece, for example.

Figure 5:
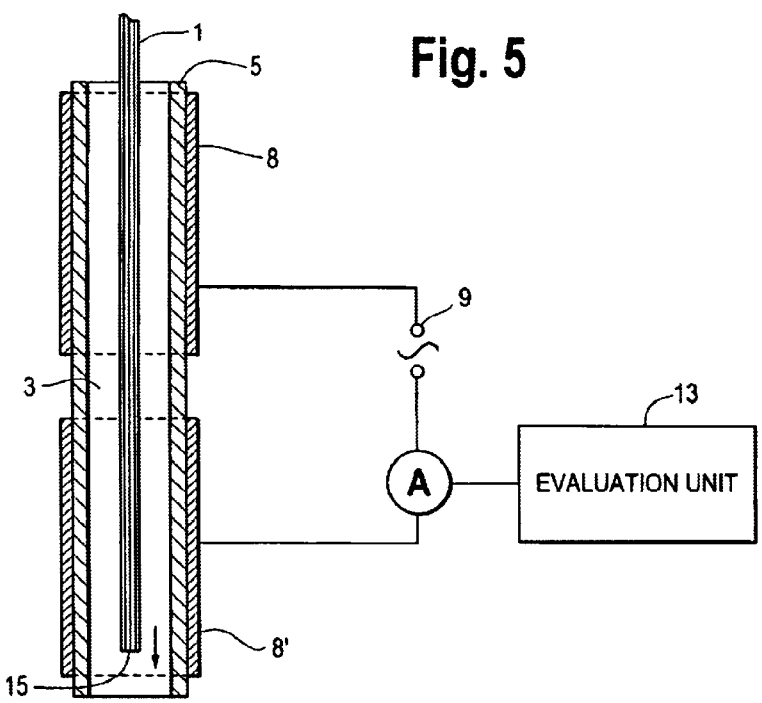
FIG. 5 is a longitudinal sectional view of another exemplary device constructed in accordance with the teachings of the invention.

Another example is shown in FIG. 5 where, in contrast to FIGS. 1–4, the capacitive component instead of the resistive component of the impedance change is evaluated for the detection of the processing electrode 1. As in FIG. 1, a cylindrical protective sleeve 5 made of an insulating material encompasses a measuring area 3 through which a wire electrode 1 moves in the axial direction. In contrast to the preceding examples, the measuring electrodes 8, 8' are mounted on the outside of the protective sleeve 5 and cover most of the measuring area. The measuring electrodes 8, 8' comprise two small tubes, each of which covers about half of the measuring area 3. Applying a high-frequency alternating voltage generates an electric field between the electrode 8 and the wire electrode 1 and between the wire electrode 1 and the electrode 8'. The capacity of this arrangement varies virtually linearly with the position of the wire tip 15. Of course, a conductive transport fluid would interfere with the detection in this case because an electronic evaluation system as per the example in FIG. 10b (comprising a voltage source, a current sensor and an evaluation unit) would be permanently blocked by an excessively low value of the sensor resistance Rs. Accordingly, the example of FIG. 5 is suitable only for a transport fluid conductance of less than approximately 1 µS/cm. However, the above example is highly suitable for gaseous or hydrocarbon-type transport fluids.

Various methods for measuring a capacity are known in the art. For example, an oscillating circuit can be formed together with the capacitor where the capacity is the element that determines the frequency, to thereby allow a simple and robust evaluation using digital means, such as a microprocessor or the like. Alternatively, the displacement current can be used as a measured variable, as disclosed in German Patent DE 28 26 270 C2, for example, which was filed by the applicant, and which is hereby incorporated herein by reference.

The frequency of the alternating voltage source 9 should be considerably higher for capacitive detection than for the above described resistive method.

The detection method which is based on the capacity change has an advantage over the resistive method in that the measuring electrodes can be fully isolated from the transport fluid and that the transport fluid does not need to be conductive. Therefore, the method is especially suitable when the transport fluid is air or a hydrocarbon.

Figure 6:
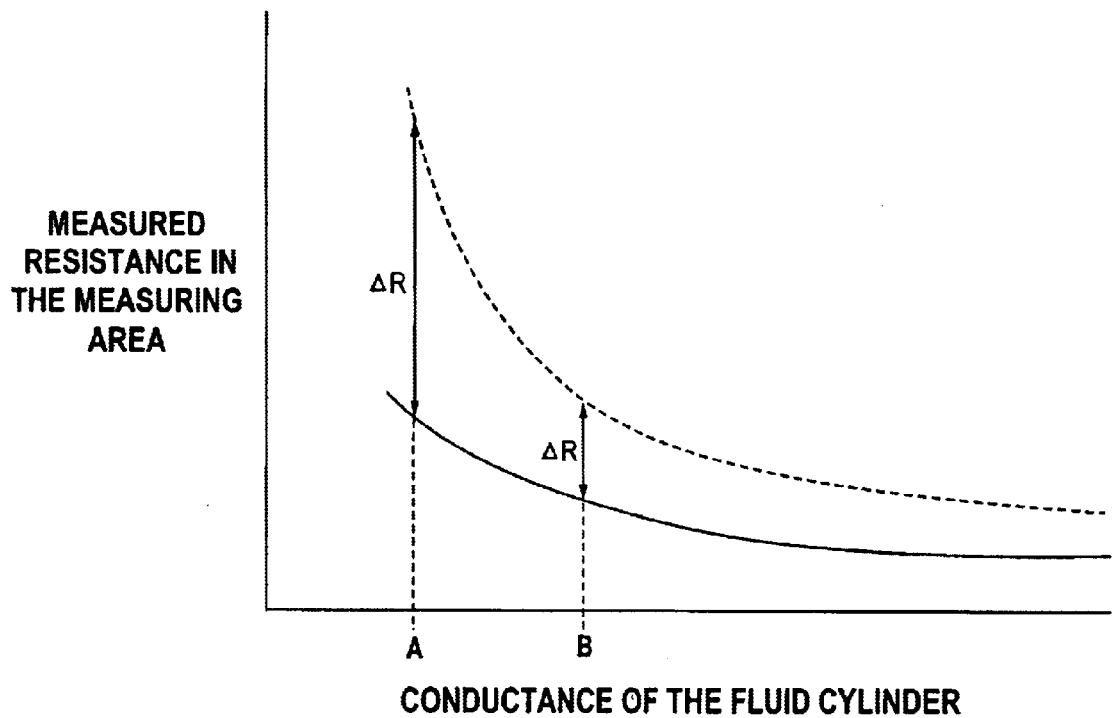
FIG. 6 is a graph of the relationship of the resistance measured in the measuring area and the conductance of the transport fluid.
Figure 7:
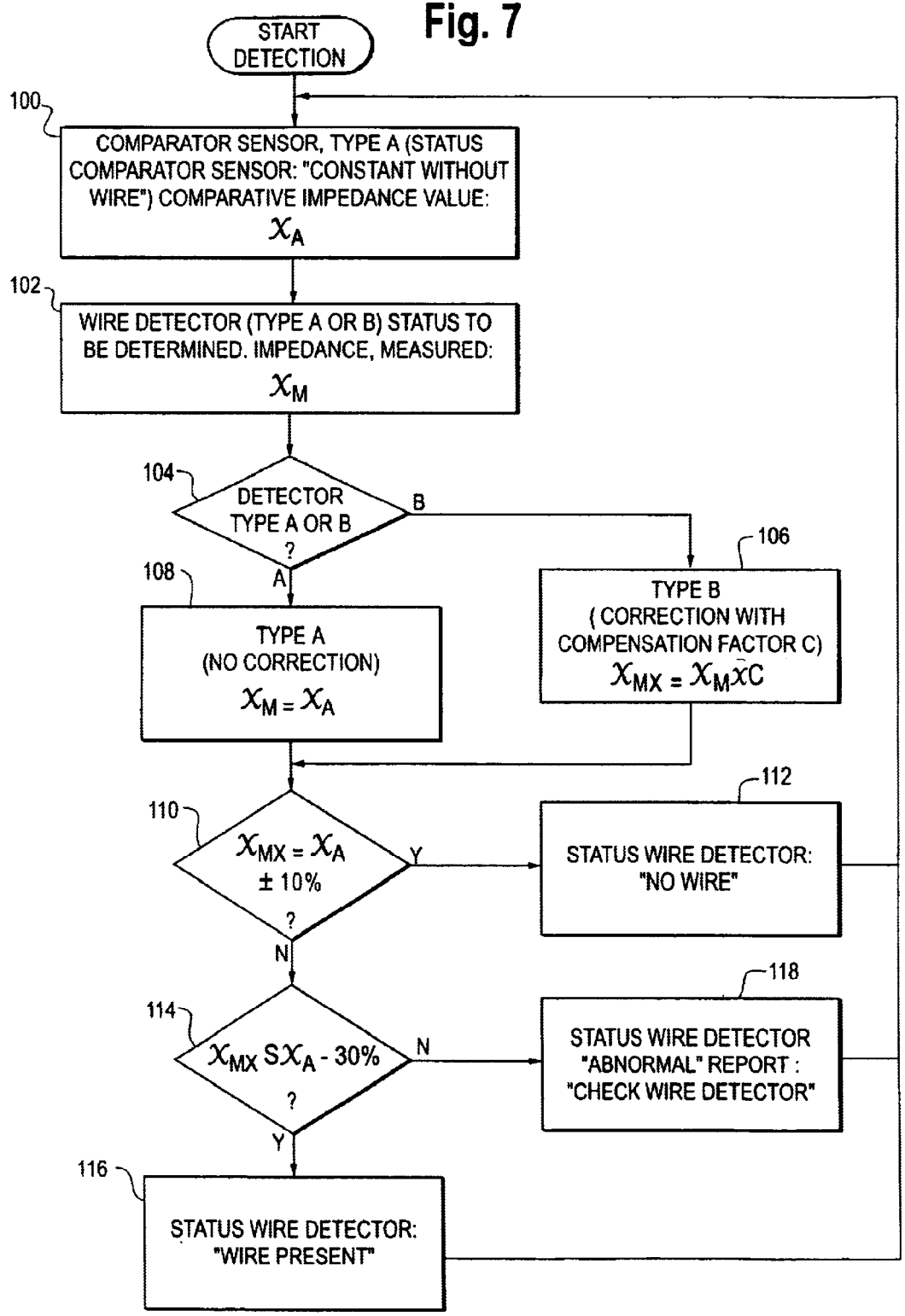
FIG. 7 is a flow chart of an exemplary comparator sensor method performed in accordance with the teachings of the invention.

FIGS. 6 and 7 illustrate an example of the comparator sensor method in a wire spark erosion machine. This method is insensitive to variations in the conductance of the transport fluid and thus offers a solution for the above mentioned conflict of interest between the measuring sensitivity and the size of the device as it enables the detection of a processing electrode 1 with the highest sensitivity by means of a detection device whose dimensions are optimally adapted to the requirements of the electrode moving system.

As mentioned above, it is advantageous to adapt the inside diameter of a wire detection device to the inside diameter of the remaining wire moving system because cross-sectional changes in the wire moving system will result in a pressure loss in the transport fluid and make the insertion of the wire electrode 1 unreliable. The inside diameter of a normal wire moving system is relatively large, however. When the inside diameter $D_S$ of the wire detection device is large the resistance of a fluid cylinder between two ring-shaped measuring electrodes $R_{W1}$ is relatively low because of its large cross-sectional surface $\pi D_S^2/4$ (see equation 2). However, if the resistance $R_{W1}$ of the fluid cylinder between the measuring electrodes is already low, the proportional decrease in the resistance when the wire electrode 1 moves through the measuring area is also small and the measuring sensitivity is low. This can be counteracted to a certain extent in that the distance L between the two measuring electrodes 7, 7' is increased so as to increase the resistance $R_{W1}$ of the fluid cylinder. However, this will result in a larger overall detection device, which is undesirable.

The above explained relationship between the measuring sensitivity and the resistance $R_{W1}$ of the fluid cylinder between the measuring electrodes is shown schematically in FIG. 6 where the resistance measured in the measuring area when the wire electrode 1 is not present (dashed line) and when the wire electrode is present (solid line) is plotted against the conductance (i.e., the reciprocal of the resistance) of the fluid cylinder. The dashed line substantially describes a hyperbola as the resistance measured in the measuring area 3 when the wire electrode 1 is not present is equivalent to the resistance of the fluid cylinder. The resistance measured when the wire electrode 1 is present is always lower while the difference ΔR between the resistance when the wire electrode 1 is present and when it is not present decreases as the conductance of the fluid cylinder increases. Therefore, when the conductance of the fluid cylinder is low (i.e., when the detector has a small inside diameter and the distance between the measuring electrodes is large), the measuring sensitivity is highest. The drop in the resistance ΔR when the wire electrode is inserted into the measuring area 3 is high enough to ensure a reliable wire detection approx. up to point B, which is approx. equivalent to a conductance of 4 µS/cm. The optimal conductance values of the fluid cylinder are between point A and point B in the example of FIG. 6.

A reliable detection of the wire electrode can be made more difficult because the conductance sensors generally used in wire spark erosion machines work with an accuracy of only ±1 µS/cm. Therefore, if a detection device is used whose large inside diameter is adapted to the remaining wire moving system and having a small distance between the measuring electrodes combined with a standard conductance sensor, a differentiation between "wire electrode present" and "wire electrode not present" may no longer be possible, or at least it is more difficult to differentiate.

Therefore, the comparator sensor method is used especially advantageously. It works independent of the absolute value of the measured conductance. In this example, a comparator sensor is installed outside the wire moving system. It is configured identical or similar to the detection device disposed in the wire moving system. The same transport fluid as that in the detection device in the wire moving system flows through the comparator sensor, but the wire electrode does not move through the comparator sensor. As a result, the reference resistance of a detection device when the processing electrode is not present is always known. If the comparator sensor and the detection device are configured identically the impedance of the two, with no wire moving through, is the same within a few percent. A massive reduction in the impedance in the detection device compared to the impedance in the comparator sensor (for example minus 30%) will therefore clearly be interpreted as a wire moving through.

Alternatively, the comparator sensor can be used in combination with detection devices that are not identical but similar (i.e., only the geometric dimensions are modified). The characteristics of the detection devices that are not identical with the comparator sensor are measured and recorded and taken into consideration by means of a conversion factor.

An example of the comparator sensor method is illustrated in the form of a flow chart in FIG. 7. After the detection starts the comparative impedance value $X_A$ of the comparator sensor is measured first, which in this case has the geometric dimensions of a detector type A (block 100). In the next step (block 102), the impedance $X_M$ of the wire detection device (wire detector) is measured. Subsequently, it is determined whether the wire detector is of the same type as the comparator sensor or whether it has different geometric dimensions, for example those of a type B (block 104). If the wire detector is a type B, the measured impedance value $X_M$ is multiplied with the appropriate compensation factor C (block 106). Otherwise, the impedance $X_M$ measured in the wire detector is compared directly with the impedance in the comparator sensor (block 108). If the impedance in the comparator sensor and that in the wire detector are similar within a range of ±10% (block 110), a "no wire (electrode)" status is reported for the wire detector (block 112). If the two impedance values differ by more than 10% (block 110), the next step will verify whether the impedance of the wire detector $X_{MX}$, which may have been corrected by means of the compensation factor, is more than 30% lower than the impedance in the comparator sensor (block 114). If this is the case, the wire detector will be reported as being in the "wire (electrode) present" status (block 116). Otherwise an error message will be generated (block 118). This comparator sensor method allows a highly reliable detection of the wire electrode 1 in the wire moving system.

Figure 8:
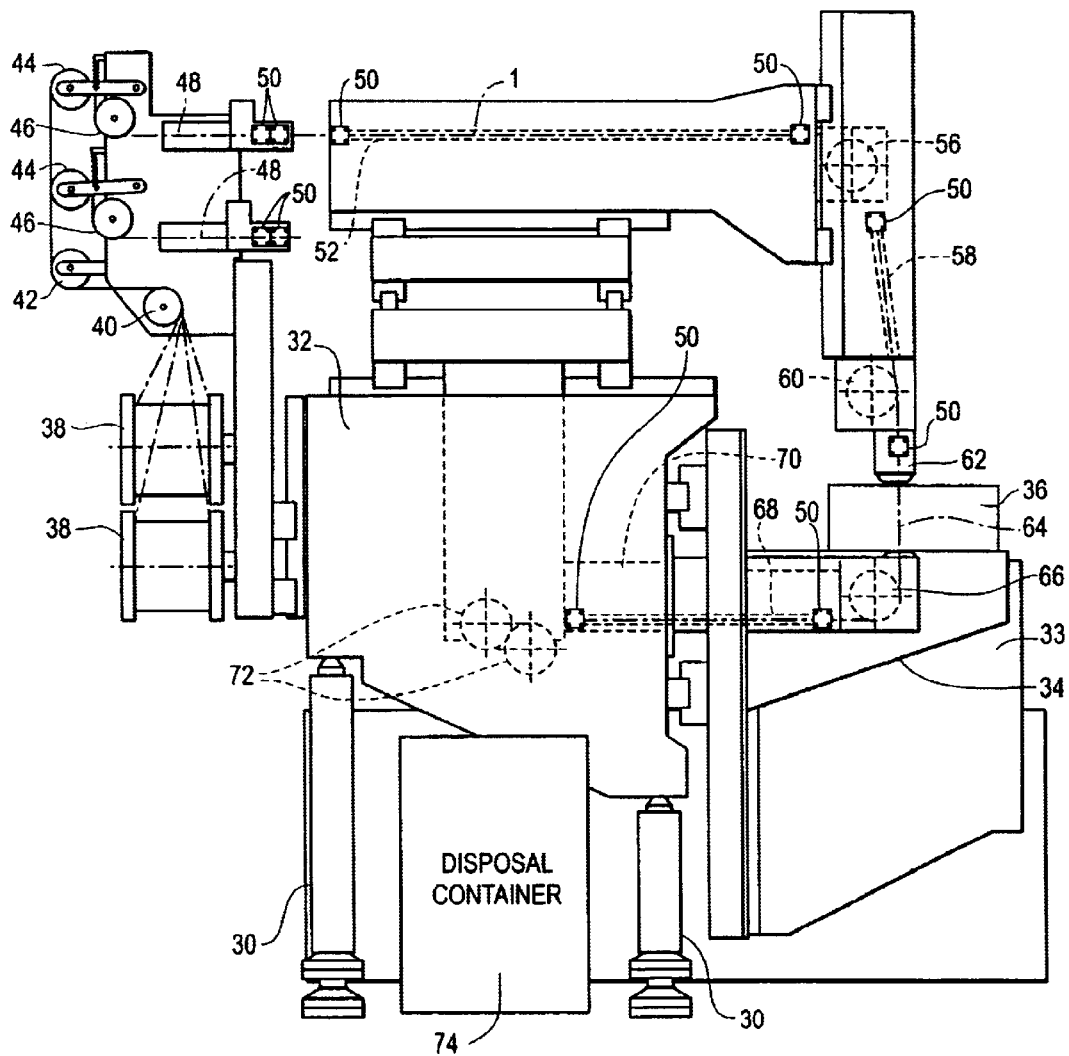
FIG. 8 is a longitudinal sectional view of a spark erosion machine in which exemplary devices constructed in accordance with the teachings of the invention are integrated in several places within the wire moving system.

FIG. 8 shows a profile of a wire spark erosion machine where detection devices of the above described type are mounted in various places in the wire moving system.

The machine frame of the wire spark erosion machine comprises a central machine body 32 which is supported by three upright pillars 30. At the front (facing the work area of the machine) of the machine body a movable X-console 33 is disposed. A beam-like work piece support 34 (shown schematically in FIG. 8), is mounted on the console 33 where a work piece 36 is mounted by means of suitable fastening means. For a further description of the wire spark erosion machine illustrated in FIG. 8, please see the German patent application number 199 32 645.2-34 filed by the applicant and which is hereby incorporated herein by reference. Only the wire moving system of the illustrated wire spark erosion machine will be explained below.

The wire electrode 1, shown schematically, is uncoiled as usual under tensile stress from a dispenser roll 38 on the rear of the machine body 32. It is moved via several pulleys 40, 42 to the so-called dancer arm 44. The dancer arm 44 is elastically biased upward via a spring so as to compensate the variations in the wire length developing when the wire is uncoiled from the dispenser roll 38. The wire electrode 1 is moved via another pulley 46 into a wire preparation device 48 whose purpose is to pull in a wire electrode 1 so as to prepare it for the following insertion process. Two each of the components of the wire moving system are provided in the spark erosion machine in FIG. 8 so as to prepare two types of wire electrodes for an automated replacement.

In the starting area of the wire preparation device 48, the first wire detection devices 50 are disposed which allow the verification of the initial insertion step and monitor the loading status in the wire preparation device 48. From the wire preparation device 48, the wire electrode 1 is led past another wire detector 50 on the outside of a crossbeam acting as a wire guiding arm into a wire guiding tube 52. This typically takes place under the effect of an injector nozzle, which is not shown and which generates a fluid stream by means of which the wire electrode 1 is moved through the tube 52. At the end of the wire guiding tube 52, the wire electrode 1 is rerouted via a pulley 56 in the direction of the work piece 36 and led into another wire guiding tube 58. Because rerouting the wire represents a particularly critical place in the wire moving system with a higher error rate for inserting and reinserting after a wire break or when the wire is cut, additional wire detection devices 50 are disposed before and after the pulley 56. From the wire guiding tube 58, the wire electrode 1 continues to the brake roll 60 around which it loops once. The brake roll 60 generates the tensile stress on the wire electrode 1 which is required for the spark erosion process in the work area. From the brake roll 60, the wire electrode 1 moves through the top wire guiding head 62 where a current supply unit is provided so as to activate by means of the processing current. Another wire detector 50 is integrated into the current supply unit. The wire electrode 1 continues from the top wire guiding head 62 through the work area (where a work piece 36 is mounted for machining), to the bottom wire guiding head 64 where it is rerouted again by means of the pulley 66, past another wire detector 50 and into the wire guiding tube 68. The tube 68 leads past another wire detector 50 to a wire pulling device 72 that maintains the wire tension. From there the wire electrode 1 drops into a disposal container 74.

The illustrated example of a wire spark erosion machine shows that the disclosed wire detectors can be used in many different places within the wire moving system, because of its highly compact size. The detection of the wire position is useful, especially in the wire guiding heads, before and after the pulleys and in the wire preparation device, for example after a wire break or when it is cut intentionally. In order to further facilitate the use of the detection device, it is possible to install the wire detector in another component of the wire moving system, for example in a drive nozzle or a wire guiding head. Alternatively, the detection device can be configured as a modular component which can be installed directly in certain places in the wire moving system. Because of the large number of units, lower manufacturing costs per unit can be achieved.

The above described arrangement of multiple wire detection devices along the wire moving system allows that the movement of the wire to be fully monitored.

The signals from the wire detection devices are evaluated by a control system and combined with other information on the movement of the wire. Such additional sources of information on the wire moving system may, for example, include the generator that generates the operating voltage required for the spark erosion and which detects a wire break in the work area because of a drop in the operating current, a wire position sensor that measures the displacement of the wire electrode in the plane vertical to the direction in which it advances, an instrument for measuring the wire tensile force, and the angle indicator on the dispenser roll, the brake roll, the pulling rolls, etc. The control system is able to develop a comprehensive picture of the situation in the wire moving system based on a combination of the above information. It is able to diagnose any malfunctions and take the necessary steps to restore the proper movement of the wire. In particular, based on the wire detection signals the control system is able to activate suitable moving means within the wire moving system, for example suction and injector nozzles, so as to securely insert and move the wire electrode. For this purpose, strategies can be developed that define the control of the wire movement in various situations. Such strategies are intended to prevent malfunctions in inserting, moving and further handling of the wire electrode.

Figure 9:
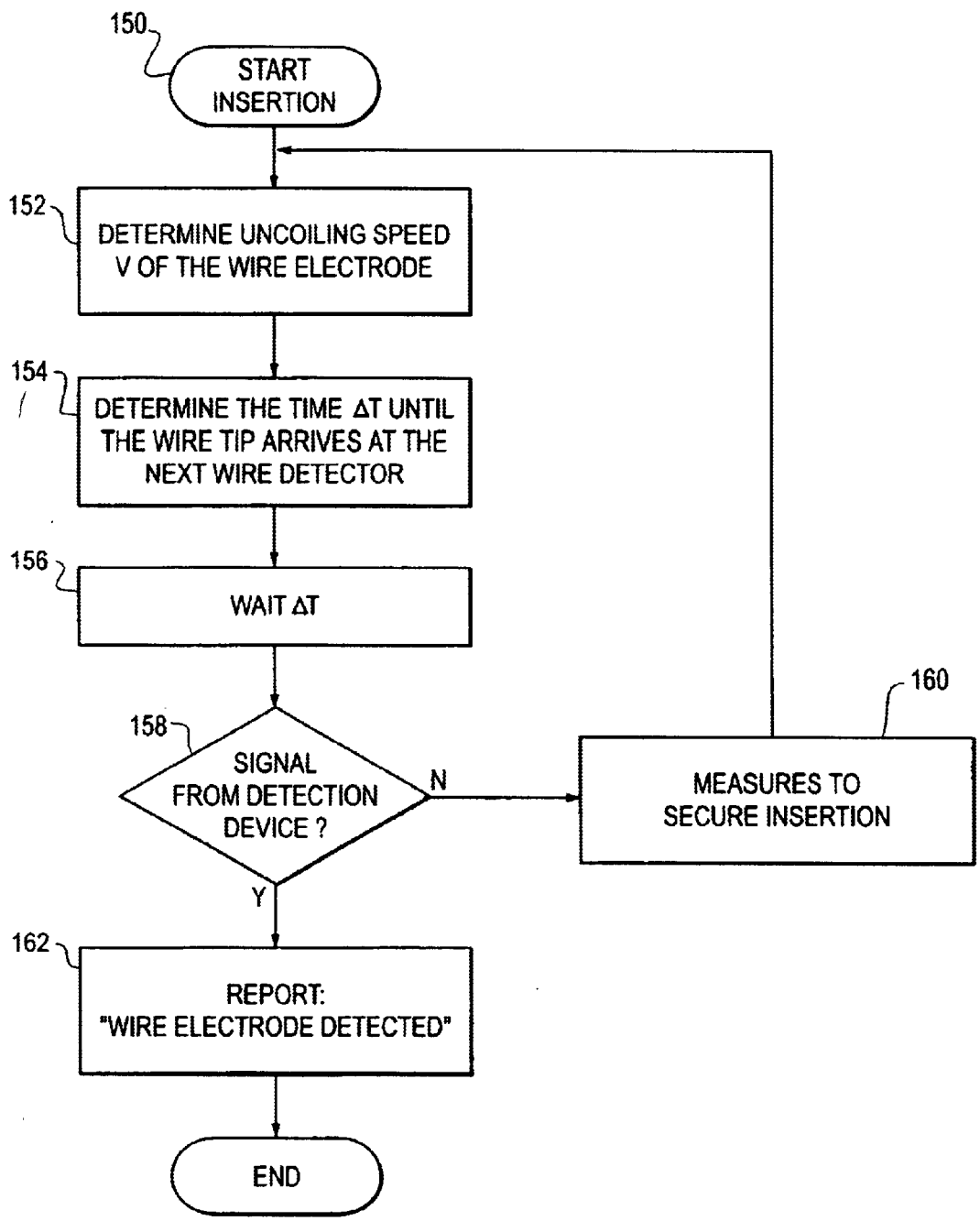
FIG. 9 is a flow chart of an exemplary wire moving strategy.

One example of such a wire moving strategy is illustrated in FIG. 9. When the insertion process begins (block 150), the control system calculates the uncoiling speed of the wire electrode 1 based on the remaining wire length on the dispenser roll and the speed of the dispenser roll (block 152). Based on the uncoiling speed, it calculates the time at when the wire tip is expected to arrive at the next wire detector if it is properly inserted (block 154) and it waits for a detection signal from the wire detection device after the time Δt has elapsed (block 156). If the signal is not received within the calculated time (block 158), predetermined measures or sequences of measures are taken automatically so as to correct the error (block 160). Otherwise, a "wire electrode detector" report is issued (block 162).

Figure 10A:
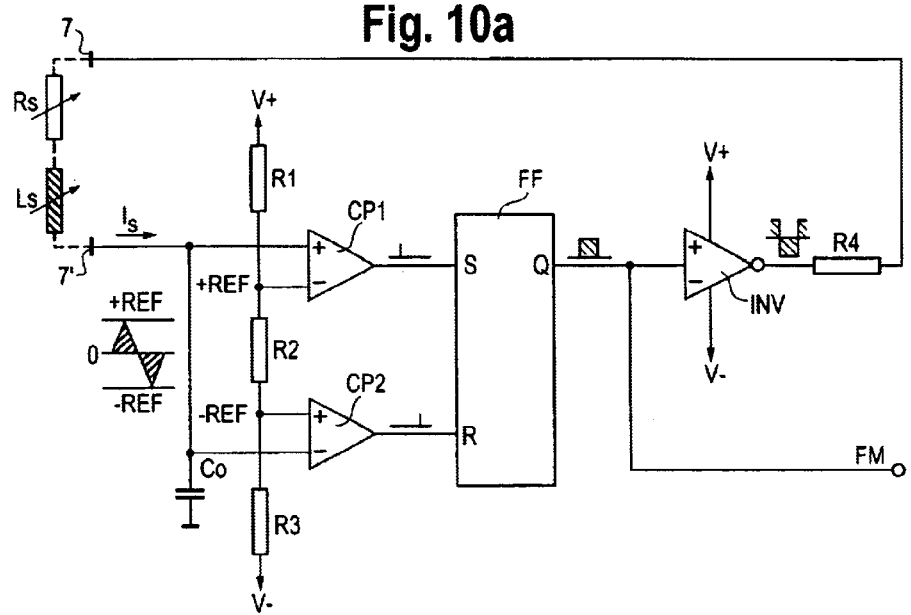
FIG. 10a is an electrical circuit diagram of an example electronic evaluation system in the resistive/inductive operating mode.

FIG. 10a shows an example of a circuit for an electronic evaluation system with inductive and/or resistive detection of the measured value. The circuit includes all necessary components for the sensor, namely an alternating voltage source 9 referenced INV, the current sensor 11 comprising the capacitor Co and the comparators CP1 and CP2, and the flip-flop FF, representing the evaluation unit 13. Only one bipolar supply voltage V+, V−of +/−15 VDC, for example, has to be provided. The function is the same as that of a commercially sold CMOS timer element, model TLC555 specified in data sheet D2784, November 1991, made by TEXAS INSTRUMENTS, Dallas, U.S.A.

The resistances R1, R2 and R3 serve to determine a positive +Ref and a symmetrical negative −Ref reference voltage of +1 V and −1 V, for example.

The capacitor Co is alternately charged positive and negative up to said reference voltages by means of the sensor current Is. Thus, the loading time is proportional with the sensor resistance Rs and the frequency is proportional with the sensor current Is. Because of its frequency-dependent impedance, the sensor inductance Ls is similar in behavior and has only a minor effect on the linear function. The flip-flop FF converts the setting and resetting pulses of the comparators CP1 and CP2 into a logic signal FM, which in turn switches the inverter INV to the V− and V+ voltages. The resistance R4 serves to limit the maximum sensor current Is and, thus, the maximum frequency of the sensor. The sensor output is generated directly by the logic signal FM. The frequency-modulated signal FM can easily be transmitted over a long distance and is very easily evaluated by means of a microprocessor. The circuit is suitable for all of the disclosed measuring arrangements, except for the one shown in FIG. 5.

Figure 10B:
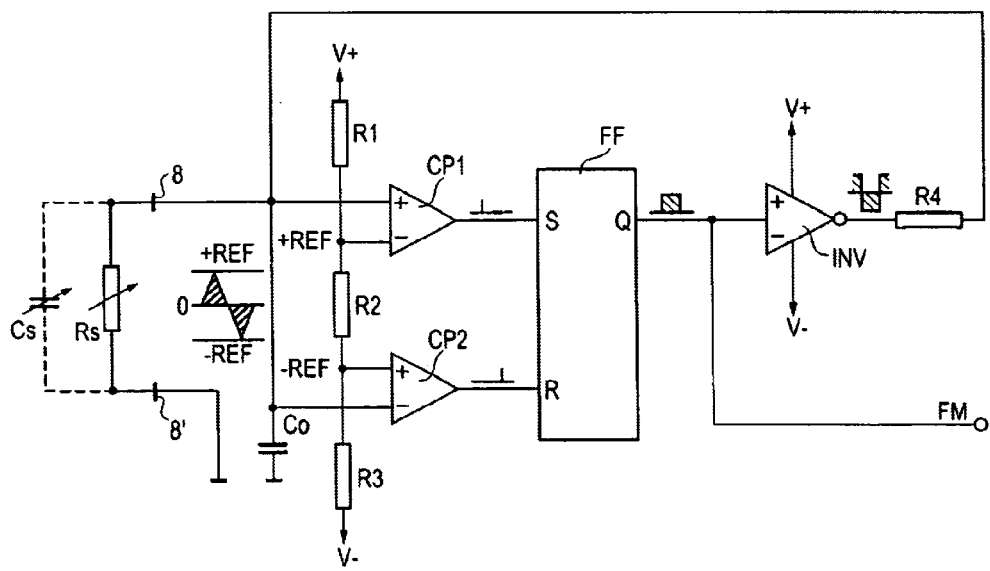
FIG. 10b is an electrical circuit diagram of an example electronic evaluation system in the capacitive operating mode.

FIG. 10b shows the same circuit, but it is configured for a sensor capacity Cs and it is suitable for the measuring arrangement as per FIG. 5. The capacity Co should be as low as possible or zero so as to achieve a high resolution as the loading time in this case is proportional to the sum of the variable sensor capacity Cs and Co. Therefore, a high capacity Co would result in only a minor frequency change. In this case, the resistance R4 serves to determine the frequency range. Otherwise, the function and characteristics are identical to those of the circuit as per FIG. 10a.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A device for detecting a processing electrode of a machine tool, the device comprising:
   a measuring area through which the processing electrode can be moved, the measuring area being filled with a transport fluid having an electrical conductivity that differs from an electrical conductivity of the processing electrode;
   at least one measuring electrode disposed in the measuring area; and
   a detecting circuit in communication with the at least one measuring electrode to detect an impedance change in the measuring area caused by the processing electrode passing through the transport fluid in the measuring area.

2. A device as defines in claim 1, wherein the at least one measuring electrode comprises at least two measuring electrodes which are spaced apart in a direction in which the processing electrode is intended to advance through the measurement area.

3. A device as defined in claim 1, wherein the at least one measuring electrode comprises at least two measuring electrodes, and one of the measuring electrodes is the processing electrode.

4. A device as defined in claim 1, wherein the impedance change is a change in at least one of: a change in a resistive impedance, a change in a capacitive impedance and a change in an inductive impedance.

5. A device as defined in claim 4, wherein the detection circuit comprises an electronic evaluation system that evaluates a resistive component of the impedance change, and wherein a transport fluid having a minimum electrical conductivity is present between the processing electrode and the at least one measuring electrode.

6. A device as defined in claim 5, wherein the transport fluid has a minimum conductivity of 1 μS/cm.

7. A device as defined in claim 4, wherein the detection circuit comprises an electronic evaluation system that evaluates a capacitive component of the impedance change, and wherein one of an insulating transport fluid and a low conducting transport fluid is present between the processing electrode and the at least one measuring electrode.

8. A device as defined in claim 7, wherein the transport fluid has a maximum conductivity of 1 μS/cm.

9. A device as defined in claim 1, wherein the detecting includes a capacitor, two comparators, a flip-flop and an inverter, wherein the impedance change effects a loading time of the capacitor which is alternately charged positive and negative by a charging voltage having an alternating polarity, wherein the two comparators limit the charging voltage and change the polarity of the charging voltage via the flip-flop and the inverter, and wherein a logic output of the flip-flop provides a signal proportional to the impedance change.

10. A device as defined in claim 1, wherein the at least one measuring electrode is U-shaped.

11. A device as defined in claim 1, wherein the at least one measuring electrode is a ring.

12. A device as defined in claim 1, wherein the at least one measuring electrode is sealed against transport fluid.

13. A device as defined in claim 1, wherein at least when measuring, an alternating voltage is applied to at least one of the at least one measuring electrode.

14. A device as defined in claim 1, wherein the measurement area has an inside diameter that is substantially equal to an inside diameter of a moving path of the processing electrode.

15. A device as defined in claim 1, wherein the measurement area has an inside diameter that is substantially smaller than an inside diameter of a moving path of the processing electrode, and wherein a portion of transport fluid is guided around the measuring area by a bypass.

16. A device as defined in claim 15, wherein the at least one electrode comprises at least a portion of a transformer, the transformer encompasses the measuring area but not the bypass such that a secondary winding is formed by: (a) the processing electrode, (b) the measuring area, and (c) the bypass, wherein an alternating voltage is applied to a primary winding of the transformer, wherein the change in impedance is a change in an impedance in the secondary winding, and wherein a current sensor detects the change in impedance of the secondary winding and, thus, a position of a tip of the processing electrode based on a sensed current.

17. A device as defined in claim 1, further comprising at least one of a wire spark erosion machine, a cavity sinking spark erosion machine, a drilling spark erosion machine, a milling spark erosion machine, and a micro cavity sinking spark erosion machine.

18. A wire spark erosion machine comprising:
a processing electrode feeding system; and
a detection device for monitoring movement of the processing electrode through the machine, the device comprising:
   a measuring area through which the processing electrode can be moved, the measuring area being filled with a transport fluid having an electrical conductivity that differs from an electrical conductivity of the processing electrode;
   at least one measuring electrode disposed in the measuring area; and
   a detecting circuit in communication with the at least one measuring electrode to detect an impedance change in the measuring area caused by the processing electrode passing through the transport fluid in the measuring area.

19. A wire spark erosion machine as defined in claim 18, wherein the wire electrode feeding system further comprises a wire guiding head and a drive nozzle, and wherein the detection device is structurally integrated within at least one of the wire guiding head and the drive nozzle.

20. A method for detecting a processing electrode of a machine tool, the method comprising the steps of:
providing a first measuring area through which the processing electrode can be moved, the measuring area being filled with a transport fluid having an electrical conductivity that differs from an electrical conductivity of the processing electrode;
monitoring an impedance in the first measuring area with at least one measuring electrode; and
determining whether the processing electrode passing through the transport fluid in the first measuring area based on a change in the monitored impedance.

21. A method as defined in claim 20, wherein the change in the impedance is identified by comparing the impedance in the first measuring area with an impedance in a second measuring area through which the processing electrode does not move, the first and second measuring areas being filled with one of identical and substantially similar transport fluid.

22. A method as defined in claim 21, wherein measurements of the impedances in the first and the second measuring areas are performed with one of identical and substantially similar detection devices.

23. A method as defined in claim 20, wherein the monitored impedance comprises at least one of a resistive impedance, a capacitive impedance, and an inductive impedance.

24. A method as defined in claim 20, wherein the monitored impedance comprises a resistive impedance, and the measuring area is filled with a transport fluid having a more than a predetermined minimum electrical conductivity.

25. A method as defined in claim 20, wherein the monitored impedance comprises a capacitive impedance, and the measuring area is filled with at least one of an insulating transport fluid and a low conducting transport fluid.

26. A method as defined in claim 20, wherein the at least one measuring electrode comprises at least a portion of a transformer, wherein the transformer encompasses the measuring area but not a bypass, wherein a secondary current is induced in the processing electrode when an alternating voltage is applied to a primary winding of the transformer, wherein the secondary current is dependent on a position of a tip of the processing electrode, wherein a position of the tip is determined based on a proportional change in a primary current, and wherein a transport fluid within the measurement area has a more than a predetermined minimum electrical conductivity.

27. A method as defined in claim 20, wherein a diameter of the processing electrode is determined based on the impedance change when the processing electrode moves through the measuring area.

28. A method as defined in claim 20, wherein a surface quality of the processing electrode is evaluated based on the impedance change when the processing electrode moves through the measuring area and the processing electrode has a known diameter.

29. A method as defined in claim 28, wherein the surface quality is a degree of contamination.

30. A method as defined in claim 20, wherein a predetermined wire moving strategy is triggered in response to a measured position of the processing electrode.

* * * * *